(12) United States Patent
Lasserre et al.

(10) Patent No.: US 11,356,116 B2
(45) Date of Patent: Jun. 7, 2022

(54) METHODS AND DEVICES FOR ON-THE-FLY CODER MAPPING UPDATES IN POINT CLOUD CODING

(71) Applicant: BlackBerry Limited, Waterloo (CA)

(72) Inventors: Sébastien Lasserre, Thorigné-Fouillard (FR); David Flynn, Darmstadt (DE)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 17/267,823

(22) PCT Filed: Sep. 9, 2019

(86) PCT No.: PCT/CA2019/051258
§ 371 (c)(1),
(2) Date: Feb. 11, 2021

(87) PCT Pub. No.: WO2020/069601
PCT Pub. Date: Apr. 9, 2020

(65) Prior Publication Data
US 2021/0167795 A1    Jun. 3, 2021

(30) Foreign Application Priority Data

Oct. 3, 2018 (EP) .................................... 18306304

(51) Int. Cl.
*H03M 7/30* (2006.01)
(52) U.S. Cl.
CPC ....... *H03M 7/6035* (2013.01); *H03M 7/6076* (2013.01)
(58) Field of Classification Search
CPC ..... H03M 7/30; H03M 7/6076; H03M 7/6035

USPC ...................................................... 341/51–95
See application file for complete search history.

(56) References Cited

U.S. PATENT DOCUMENTS

| | | | | | |
|---|---|---|---|---|---|
| 4,361,300 | A | * | 11/1982 | Rush | B61L 21/10 246/5 |
| 9,600,244 | B1 | * | 3/2017 | Hwang | G06F 8/70 |
| 10,693,492 | B1 | * | 6/2020 | Lasserre | H03M 7/6011 |
| 10,992,947 | B2 | * | 4/2021 | Lasserre | H04N 19/46 |
| 11,075,647 | B2 | * | 7/2021 | Rigo | H03M 7/6023 |
| 2003/0214502 | A1 | | 11/2003 | Park et al. | |
| 2013/0114707 | A1 | * | 5/2013 | Seregin | H04N 19/11 375/E7.243 |
| 2017/0046222 | A1 | * | 2/2017 | Kern | G06F 11/1044 |
| 2017/0347100 | A1 | * | 11/2017 | Chou | H03M 7/3059 |

(Continued)

OTHER PUBLICATIONS

International Search Report and Written Opinion, PCT Application No. PCT/CA2019/051258 dated Nov. 18, 2019.

(Continued)

*Primary Examiner* — Lam T Mai
(74) *Attorney, Agent, or Firm* — Rowand LLP

(57) ABSTRACT

Methods and systems for encoding and decoding data, such as point cloud data. The methods may include using a coder map to map a range of discrete dependency states to a smaller set of binary coders each having an associated coding probability. The selection of one of the discrete dependency states may be based on a contextual or situational factors, which may include a prediction process, for a particular symbol, such as an occupancy bit. The coder map is updated after each symbol is coded to possibly alter to which binary coder the selected discrete dependency state maps.

22 Claims, 8 Drawing Sheets

(56) References Cited

U.S. PATENT DOCUMENTS

| | | | |
|---|---|---|---|
| 2020/0319593 A1* | 10/2020 | Nam | G06T 7/0002 |
| 2021/0192797 A1* | 6/2021 | Lasserre | G06T 9/001 |
| 2021/0218969 A1* | 7/2021 | Lasserre | H04N 19/517 |
| 2021/0407147 A1* | 12/2021 | Flynn | H04N 19/182 |
| 2021/0407148 A1* | 12/2021 | Flynn | H04N 19/174 |

OTHER PUBLICATIONS

Extended European Search Report, EP Application No. 18306304.9 dated Apr. 11, 2019.
Ruwen Schnabtl et al: "Octree-Based Point Cloud Compression" Jul. 29, 2006.
Armin Hornung et al: "OctoMap: an efficjent probabilistic 3D mapping framework based on octrees" Feb. 7, 2013.
Stefan Gumhold et al: "Predictive point-cLoud compression" Jan. 1, 2005.

* cited by examiner

METHODS AND DEVICES FOR ON-THE-FLY CODER MAPPING UPDATES IN POINT CLOUD CODING

FIELD

The present application generally relates to data compression and, in one particular example, to methods and devices for coding of point clouds using a finite set of binary coders. The present application describes methods and devices for on-the-fly updates to a coder mapping between predictions and binary coders.

BACKGROUND

Data compression is used in communications and computer networking to store, transmit, and reproduce information efficiently. In many cases of data compression, a prediction is found from previously-coded data, temporally or spatially, and the coding of current data takes into account the prediction. In context-based coding, the prediction may be used as the basis for selecting a context for coding the data, for example.

As an example, point cloud coding may make use of predictions to guide context selection.

It will be appreciated that certain data types, like point clouds, can involve large quantities of data and compressing (encoding and decoding) that data quickly and accurately is of significant interest. Accordingly, it would be advantageous to provide for methods and devices that more efficiently and/or effectively compress data, such as for point clouds.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
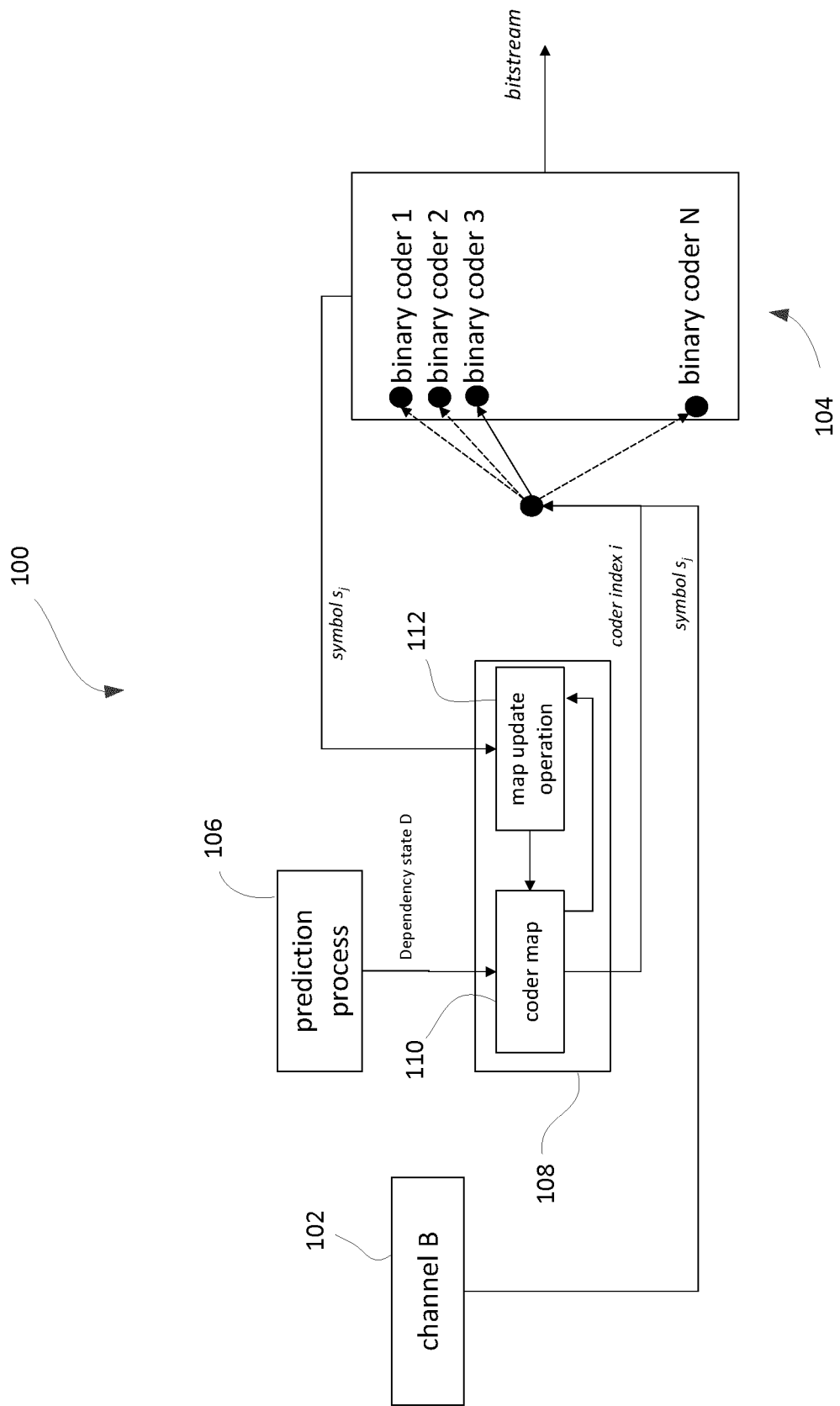
FIG. 1 shows a simplified block diagram of an example symbol encoder in accordance with one aspect of the present application.

The present application describes methods and systems for encoding and decoding data, such as point cloud data. The methods may include using a coder map to map a range of discrete dependency states to a smaller set of binary coders each having an associated coding probability. The selection of one of the discrete dependency states may be based on a contextual or situational factors, which may include a prediction process, for a particular symbol, such as an occupancy bit. The coder map is updated after each symbol is coded to possibly alter to which binary coder the selected discrete dependency state maps.

In one aspect, the present application describes a method of encoding a point cloud to generate a bitstream of compressed point cloud data, the point cloud being located within a volume recursively split into sub-volumes and containing the points of the point cloud, wherein occupancy of sub-volumes of the volume is indicated using a bit sequence with each occupancy bit of the bit sequence indicating whether a respective sub-volume in a scan order within the volume contains at least one of the points, the method using a plurality of binary coders each having an associated probability, where the associated probabilities are distributed in the range (0, 1). The method may include, for each of the occupancy bits of the bit sequence, in turn, determining a first dependency state for that occupancy bit, where the first dependency state is one of a range of defined dependency states; identifying, using a coder map that maps each dependency state to a respective one of the binary coders, a first coder to be used in entropy encoding the occupancy bit based on the first dependency state; entropy encoding the occupancy bit using the first coder; identifying a second coder based on the first coder and a value of the occupancy bit; and updating the coder map to map the first dependency state to the second coder.

In another aspect, the present application describes a method of decoding a bitstream of compressed point cloud data to produce a reconstructed point cloud, the point cloud being located within a volume recursively split into sub-volumes and containing the points of the point cloud, wherein occupancy of sub-volumes of the volume is indicated using a bit sequence with each occupancy bit of the bit sequence indicating whether a respective sub-volume in a scan order within the volume contains at least one of the points, the method using a plurality of binary coders each having an associated probability, where the associated probabilities are distributed in the range (0, 1). The method may include, for each of the occupancy bits of the bit sequence, in turn, determining a first dependency state for that occupancy bit, where the first dependency state is one of a range of defined dependency states; identifying, using a coder map that maps each dependency state to a respective one of the binary coders, a first coder to be used in entropy decoding the occupancy bit based on the first dependency state; entropy decoding the occupancy bit from the bitstream using the first coder; identifying a second coder based on the first coder and a value of the decoded occupancy bit; and updating the coder map to map the first dependency state to the second coder.

In some implementations, the coder map may include a first look-up table that maps each dependency state to a respective one of the binary coders.

In some implementations, identifying a second coder may include determining a new probability associated with the first dependency state based on the value of the occupancy bit; and identifying the second coder from among the plurality of binary coders on the basis that the associated probability of the second coder is closest among the associated probabilities to the new probability. In some examples, determining a new probability includes determining a new probability based on the associated probability of the first coder, the value of the occupancy bit, and a fixed parameter.

In some implementations, identifying a second coder may include selecting a second look-up table if the occupancy bit is 0 and a third look-up table if the occupancy bit is 1, and wherein the second look-up table and the third look-up table each respectively map binary coder indices to updated binary coder indices.

In some implementations, identifying a first coder may include identifying, using the coder map, an intermediate coder index from among M intermediate coder indices, and identifying, based on the intermediate coder index, the first coder using a true coder map, wherein the number of binary coders is fewer than the M intermediate coder indices.

In some examples, the plurality of binary coders include a set of ε-optimal binary coders.

In some examples, the binary coders are fixed probability binary coders. In some examples, the binary coders are adaptive probability binary coders. In either case, the associated probability of each binary coder may not change during the encoding.

In some implementations, the first dependency state may be based on one or more of an intra-prediction using spatially-related point cloud data, an inter-prediction using temporally-related point cloud data, previously-coded occupancy bits of the bit sequence, and occupancy information regarding previously-coded neighbouring sub-volumes.

In another aspect, the present application describes a method of encoding a symbol in a series of symbols from a channel to generate a bitstream of compressed data in an encoder, the encoder having a plurality of binary coders each having an associated probability, where the associated probabilities are distributed in the range (0, 1). The method may include determining a first dependency state for the symbol, where the first dependency state is one of a range of defined dependency states; identifying, using a coder map that maps each dependency state to a respective one of the binary coders, a first coder to be used in entropy encoding the symbol based on the first dependency state; entropy encoding the symbol using the first coder; identifying a second coder based on the symbol; and updating the coder map to map the first dependency state to the second coder.

In one implementation, the identifying the second coder may include determining a new probability associated with the first dependency state based on the symbol; and identifying a second coder from among the plurality of binary coders on the basis that the probability associated with the second coder is closest to the new probability.

In another aspect, the present application discloses a corresponding method of decoding. The method may include, for an input bitstream of compressed data, decoding a symbol by determining a first dependency state for the symbol, where the first dependency state is one of a range of defined dependency states; identifying, using a coder map that maps each dependency state to a respective one of the binary coders, a first coder to be used in entropy decoding the symbol from the bitstream based on the first dependency state; entropy decoding the symbol using the first coder; identifying a second coder based on the symbol; and updating the coder map to map the first dependency state to the second coder.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

The present application further describes computer-implemented applications, including topography applications, cartography applications, automotive industry applications, autonomous driving applications, virtual reality applications, and cultural heritage applications, etc. These computer-implemented applications include processes of receiving a data stream or data file, unpacking the data stream or data file to obtain a bitstream of compressed point cloud data, and decoding the bitstream as described in the above aspects and its implementations. Thereby, these computer-implemented applications make use of a point cloud compression technique according to aspects and their implementations described throughout the present application.

The present application further describes methods of encoding and decoding point clouds, and encoders and decoders for encoding and decoding point clouds. In some implementations, a receiving unit receives multiplexed data which is obtained by multiplexing coded point cloud data with other coded data types such as metadata, image, video, audio and/or graphics. The receiving unit comprises a de-multiplexing unit to separate the multiplexed data into coded point data and other coded data, and at least one decoding unit (or decoder) to decode the coded point cloud data. In some other implementations, an emitting unit emits multiplexed data which is obtained by multiplexing coded point cloud data with other coded data types such as metadata, image, video, audio and/or graphics. The emitting unit comprises at least one encoding unit (or encoder) to encode the point cloud data, and a multiplexing unit to combine coded point cloud data and other coded data into the multiplexed data.

Other aspects and features of the present application will be understood by those of ordinary skill in the art from a review of the following description of examples in conjunction with the accompanying figures.

Any feature described in relation to one aspect or embodiment of the invention may also be used in respect of one or more other aspects/embodiments. These and other aspects of the present invention will be apparent from, and elucidated with reference to, the embodiments described herein.

At times in the description below, the terms "node", "volume" and "sub-volume" may be used interchangeably. It will be appreciated that a node is associated with a volume or sub-volume. The node is a particular point on the tree that may be an internal node or a leaf node. The volume or sub-volume is the bounded physical space that the node represents. The term "volume" may, in some cases, be used to refer to the largest bounded space defined for containing the point cloud. A volume may be recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

Many of the examples below will refer to the compression of point cloud data. Point clouds provide a suitable example for illustrating the advantages of the present application, as the data in a point cloud is large and predictive operations can be used to improve compression. However, it will be appreciated that point clouds are an example and that the present application provides methods and devices that may be applied to compressing other types of data for other purposes.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality systems, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point cloud data is useful, a lack of effective and efficient compression, i.e. encoding and decoding processes, may hamper adoption and deployment. A particular challenge in coding point clouds that does not arise in the case of other data compression, like audio or video, is the coding of the geometry of the point cloud. Point clouds tend to be sparsely populated, which makes efficiently coding the location of the points that much more challenging.

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A leaf node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such tree structures and the volumes and sub-volumes may have other shapes in some applications. The partitioning of a volume is not necessarily into two sub-volumes (KD-tree) or eight sub-volumes (octree), but could involve other partitions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures.

The occupancy of a point cloud is coded using occupancy flags. When an octree structure is used, the occupancy of the eight sub-volumes of a node is an occupancy pattern of eight flags: $b_0, b_1, \ldots, b_7$. Each occupancy flag signals whether its corresponding sub-volume is occupied or not. To compress the coding of this data, an encoder and decoder exploit temporal and spatial redundancies and dependencies. This may be broadly termed a "prediction", as it is an attempt to assess, using spatially-related data and/or temporally-related data, the likelihood or probability that a sub-volume is occupied. In the present application the term "dependency state" will be used to indicate the combination of factors that may be correlated to the likelihood of a sub-volume being occupied.

The occupancy pattern can be encoded using a non-binary coder in some cases; however, in the examples below arithmetic binary coders are used to code each bit of the occupancy pattern in turn. However, the coding of each successive bit in the pattern depends on the previous bits of the pattern, as they are spatially-related, meaning the coding of the last bit $b_7$ would involve 128 possible binary coders to account for the $2^7$ possible combinations of the seven preceding bits $b_0$ to $b_6$. That is, the occupancy of previously-coded sub-volumes of the same node are predictors for the occupancy of the current sub-volume. The previously-coded bits may be factored into the determination of the dependency state.

Binary coding of occupancy flags may also take into account neighbour information, which, due to spatial relationship, impacts the likelihood of occupancy. That is, the occupancy of neighbouring volumes or sub-volumes adjacent to the current node may be a further factor in the probability that a sub-volume is occupied and, thus, also used in selecting a binary coder. In some cases, through recognition of certain invariances and symmetries the $64=2^6$ possible neighbour occupancy outcomes based on occupancy of the six neighbouring nodes that share a face with the current node can be reduced to about 10 neighbour "configurations". In combination with the dependencies between bits of the occupancy pattern, this may result in about 1280 binary coders. Thus, the neighbour configuration may be a factor in determining the dependency state.

The occupancy of sub-volumes may also be predicted temporally using inter-prediction based on a previously-coded point cloud and a motion vector or motion transform, or spatially using intra-prediction based on nearby previously-coded point cloud occupancy data and an intra-coding directional vector or transform. A predicted point cloud is built using the previously-coded point cloud (reference point cloud) as translated (and possibly rotated) by the motion vector (or transform). The resulting predicted point cloud indicates whether the current sub-volume is predicted occupied or not. Adding this predictive feature doubles the number of binary coders to about 2560=1280*2. If the inter-prediction also takes on a potential outcome of "unpredicted" in addition to "predicted occupied" or "predicted unoccupied", then the number may become about 3840=1280*3 binary coders. Thus, the result of an inter- or intra-prediction process may be a factor in determining the dependency state.

The large number of binary coders may be impractical for many implementations. Also, some binary coders may not be used often enough to ensure an accurate evolution of their associated probability, thus leading to sub-optimal compression performance. This is particularly observed for smaller point clouds. Accordingly, various simplifications may be made to reduce the number of binary coders through context reduction. Example context reduction operations include reducing neighbour configurations for later bits in the bit sequence on the basis that previously-coded bits are associated with sub-volumes that screen or shield one of the neighbouring volumes, meaning the occupancy data provided by the previously-coded bits is more significant and relevant than the occupancy data associated with the shielded volume. Another example context reduction involves special handling of cases such as empty neighbour configurations or completely full neighbour configurations. Such situations may indicate a lack of directionality and, thus, less need to take into account the order of previously-coded bits associated with the sub-volumes. Finally, an example context reduction operation is applying a mapping of a set of contexts to a smaller set of contexts based on determining statistical similarities between pairs of contexts. The statistical similarities may be based on a distance metric between the pairs of contexts. Any such context reduction operations may be used individually or together in combination or sub-combination in some cases to reduce then number of contexts available for binary entropy coding at least some of the bits of an occupancy pattern. Using these techniques, it may be possible to reduce the number of binary coders to hundreds, rather than thousands.

Even if reduced to about a hundred binary coders, the quantity of coders may be too many for practical implementations. Accordingly, it would be advantageous to provide for methods and devices that aim to retain the precision of the dependency states yet reduce the number of binary coders to a more manageable quantity.

In accordance with one aspect of the present application, the number of binary coders is reduced through using a coder mapping look-up-table (LUT) to select one of the coders based on a dependency state of a symbol, and updating the LUT after coding of the symbol. In such examples, there is a fixed number of possible dependency states that is much larger than the number of binary coders. The mapping update process is an on-the-fly adaptation of the LUT based on the content being coded. The update process quickly alters the binary coder to which a dependency state maps based on the actual symbol value just coded in association with that dependency state. The binary coders may be context adaptive binary coders or fixed probability binary coders.

It will be appreciated that the solutions described herein for reducing the number of binary coders while ensuring a good match between the coder probability and the dependency state for a symbol, are more broadly applicable to coding of symbols in a channel than simply coding of octree occupancy data. Octree occupancy patterns are one type of data that may be encoded and decoded using the techniques described herein, and examples are provided that are specific to octree occupancy coding, however, it will be understood that the present application is not necessarily limited to octree occupancy coding or even point cloud coding in general.

Starting with a general channel coding framework, reference will first be made to FIG. 1, which diagrammatically shows an example channel encoding device 100. A channel 102, in this example, is a source of data symbols s for encoding. The channel 102 may include any type of data that may be compressed in a predictive coding process, including point cloud occupancy data. The symbols s may be bins.

The encoding device 100 includes a set of N binary coders 104. Each binary coder 104 has an associated probability $p_i$. As will be discussed further below, techniques may be used to select a set of N binary coders 104 having associated probabilities that are distributed over the range (0, 1). The number N of binary coders 104 and the respective associated probabilities of those binary coders 104 may be determined to achieve a minimum number of coders subject to a maximum entropy cost, i.e. error, where the "error" may account for the coding cost of using a coder having an associated probability that is different from a probability associated with the dependency state D. In other words, the error E in the mapping may be uniformly transferred to an extra cost of entropy (E+1)ε, where ε is a given parameter and the number N(ε) of coders depends on ε. Other techniques for the selecting the number of binary coders 104 and their associated probabilities may be used in some implementations, but at least one specific example will be provided later below.

The encoding device 100 includes a prediction process 106. The prediction process 106 may include any suitable operation that assesses situational factors to produce a dependency state D, where D is one of a finite number of possible dependency states, each dependency state D having a respective associated probability that the current symbol $s_j$ is a most probable symbol (MPS). For example in the case of binary symbols, the MPS may be a "1" and the dependency state D provides a probability that the current symbol $s_j$ is a "1". The present description may assume that the MPS is a 1 and that the symbol is binary. The probability falls in the range (0, 1). The finite set of dependency states D may be based on a set of contextual or situational dependencies. That is, spatially-related and/or temporally-related data may provide a set of dependencies that, in combination, produce the dependency state D. The range of possible combinations of those dependencies produces the finite set of dependency states. As an example, in the case of point cloud occupancy coding, the dependencies may include previously-coded bits of the current occupancy pattern, neighbour configuration, and/or intra or inter-predictions as to occupancy status. The number of dependency states D in the finite set of dependency states is larger, and in many implementations much larger, than the number N of binary coders 104. With a large set of dependency states, it may be impractical to provide for a binary coder 104 for each value of the dependency state D.

Accordingly, the encoding device 100 needs a mechanism for selecting one of the binary coders 104 for coding the symbol $s_j$ based on its associated dependency state D. It should be kept in mind that the dependency state D is not a predicted value of the symbol, i.e. either 1 or 0, but rather is a value that reflects the combination of dependencies and that combination is related to the likelihood of the symbol being a 1.

A mapping process 108 identifies one of the binary coders 104 based on the dependency state D provided by the prediction process 106 for the to-be-coded symbol $s_j$. The mapping process 108 may include a coder map 110 that maps each dependency state D to one of the binary coders 104. It will be understood that several dependency states D may map to the same binary coder 104, as there are far more dependency states D than binary coders 104. As will be discussed below, a look-up table (LUT) may be used to store the coder map 110. The coder map 110 produces a coder index i pointing to one of the binary coders 104. In other words, coder index i ranges from 1 to N, and is identified based on the dependency state D and the coder map 110.

In accordance with one aspect of the present application, the mapping process 108 further includes an on-the-fly update of the coder map 110 to better adapt to the characteristics of the current data in the channel 102. That is, the mapping process 108 further includes a map update operation 112. The map update operation 112 takes as an input the symbol $s_j$ that was just coded using the ith binary coder, and updates the coder map 110 entry for the dependency state D that caused selection of the ith binary coder for coding symbol $s_j$. In other words, the mapping of dependency state D to index i is adjusted to a new index $i_{update}$ based on the actual value of the symbol $s_j$, so as to adapt the coder map 110 to the characteristics of the channel 102 on-the-fly.

The map update operation 112 is a process that depends on the probabilities $p_i$ of the set of binary coders 104. In other words, the update is specific to the set of binary coders 104 being used.

In one example implementation, the map update operation 112 involves determining a new probability $p_{new}$ that corresponds to the dependency state D based on the probability $p_i$ of the ith binary coder that was just used to code $s_j$, the actual value of the symbol $s_j$, and a fixed parameter to control the aggressiveness or speed of the update. The fixed parameter may be considered a memory length, in number of symbols, as a modelling parameter for the channel. In this example, the fixed parameter is labelled L and is set to 10 for a presumed set of N=256 binary coders 104. It will be understood that these are merely examples for illustration, and that there may be more or fewer coders in some implementations and the fixed parameter L may be shorter or longer. Also, the parameter L may depend on the dependency state D.

One algorithm for determining the new probability $p_{new}$ may be expressed as:

$$p_{new}=(Lp_i+s)/(L+1)$$

In the above expression, L is the fixed parameter that controls the update speed or aggressiveness, s is the value of the symbol (in the case of a binary symbol, a 0 or 1), and $p_i$ is the probability associated with the ith binary coder to which the dependency state D is currently mapped. In the case of a binary symbol where the MPS is "0" instead of "1", the above expression may be altered to use (1−s) instead of s. After determining the new probability, the index i, to which the dependency state D is mapped, is updated to a new index $i_{update}$ that points to a binary coder 104 that has an associated probability that most closely maps to the new probability. This may be expressed as:

$$i_{update}=\arg\min_{i'}|p_{i'}-p_{new}|$$

where $i_{update}$ is the new index that dependency state D will map to, based on finding the index i' that minimizes the absolute difference between the new probability $p_{new}$ and the probability $p_{i'}$ associated with the updated index $i_{update}$.

In practical terms, the update may be implemented using look-up tables each having N entries. In a binary example, after coding a symbol based on a dependency state D that maps to index i, if the symbol $s_j$ is a zero, then LUT0 is used to identify the new index to which the dependency state D will now map, and otherwise (i.e. the symbol $s_j$ is a one) LUT1 is used to identify the new index to which the dependency state D will now map. The coder map 110 is updated accordingly.

Figure 2:
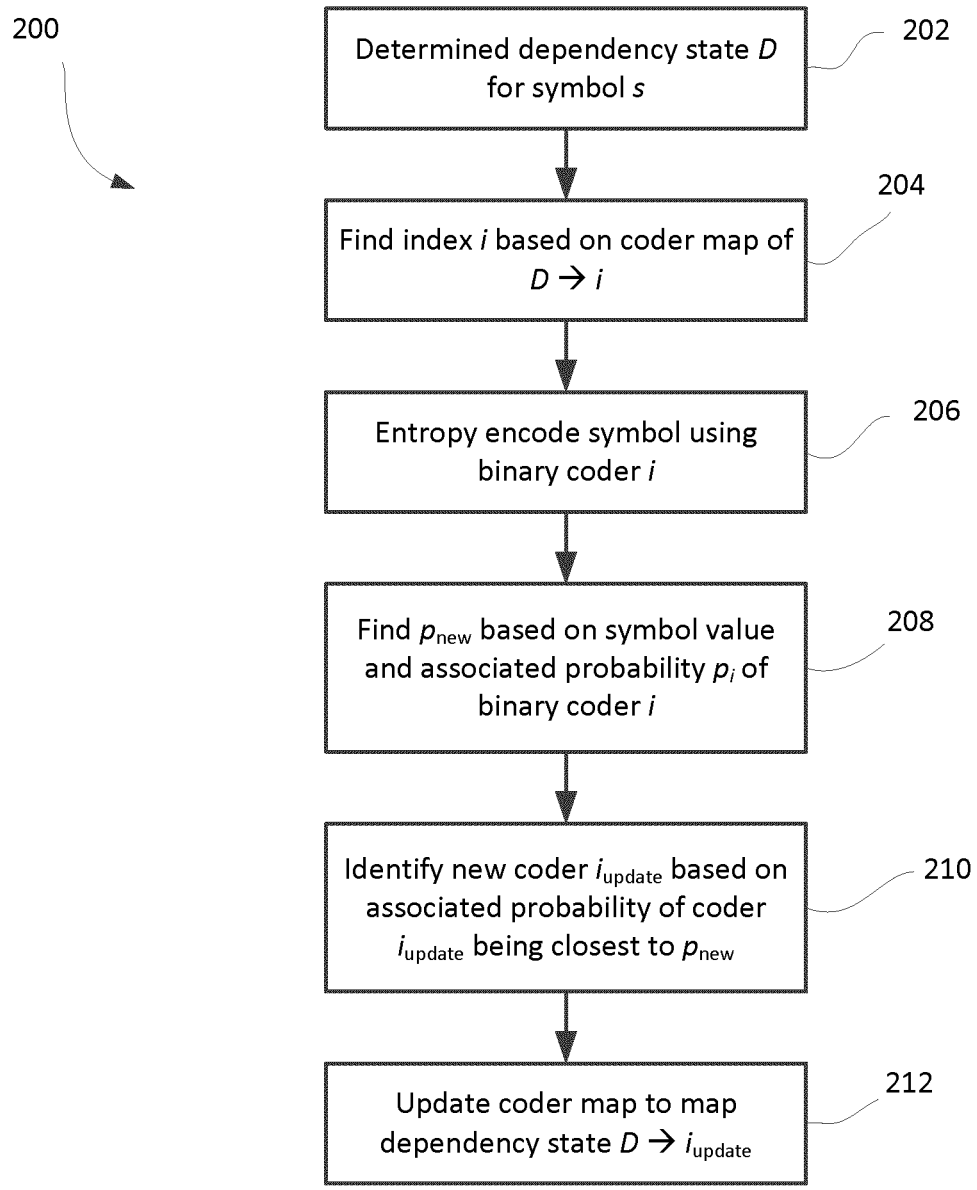
FIG. 2 shows, in flowchart form, one example method of encoding a symbol in accordance with an aspect of the present application.

Reference is now made to FIG. 2, which shows, in flowchart form, one example method 200 for encoding a symbol. The method 200 includes first determining a dependency state D for the symbol, as indicated by operation 202. The dependency state D is selected from a large but finite set of possible dependency states. The dependency state D may be based on previously-coded symbols in some cases. The dependency state D may be based on intra-prediction that takes into account spatially-related symbols. The dependency state D may be based on inter-prediction that takes into account temporally-related symbols.

In operation 204, the dependency state D is used to identify one of N binary coders using a coder map. The coder map identifies an index i to pointing to one of the binary coders based on the dependency state D. Many dependency states D may map to the same index i. The symbol is then encoded in operation 206 using the identified binary coder i.

After encoding of the symbol, in operation 208 the value of the symbol is used to determine a new probability $p_{new}$ based on the probability associated with the ith binary coder and a fixed update parameter that controls the speed of the update. The binary coder having an associated probability $p_{i_{update}}$ that is closest to the new probability $p_{new}$ is then identified and its index $i_{update}$ becomes the new index to which dependency state D is to be mapped. As noted above, in some implementations the mapping update of operations 208 and 210 is implemented using LUTs, such as LUT0 and LUT1.

Having determined the new index, the coder map is updated to change the mapping for dependency state D to the new index $i_{update}$, as indicated by operation 212.

As described above, the binary coders are each associated with a respective probability $p_i$. The probabilities $p_i$, where i=1, . . . , N, range from (0,1). In some cases, they may range from [0, 1), from (0, 1], or from [0,1]. In some embodiments, the binary coders are fixed, meaning they entropy encode each received symbol using their pre-assigned probability $p_i$. However, in some embodiments, the binary coders may be adaptive binary coders, such that the coding probability of a binary coder i may drift from the original assigned probability $p_i$. It will be appreciated that this does not necessarily alter the probability $p_i$ associated with binary coder i. The associated probability $p_i$ of a binary coder remains fixed even if the coding probability used within the binary coding process drifts due to adaptation.

The above described coder mapping and update process is presented for a generic channel producing symbols. To illustrate its application to the specific case of point cloud coding, and in particular, occupancy pattern coding, reference is now made to FIG. 3.

Figure 3:
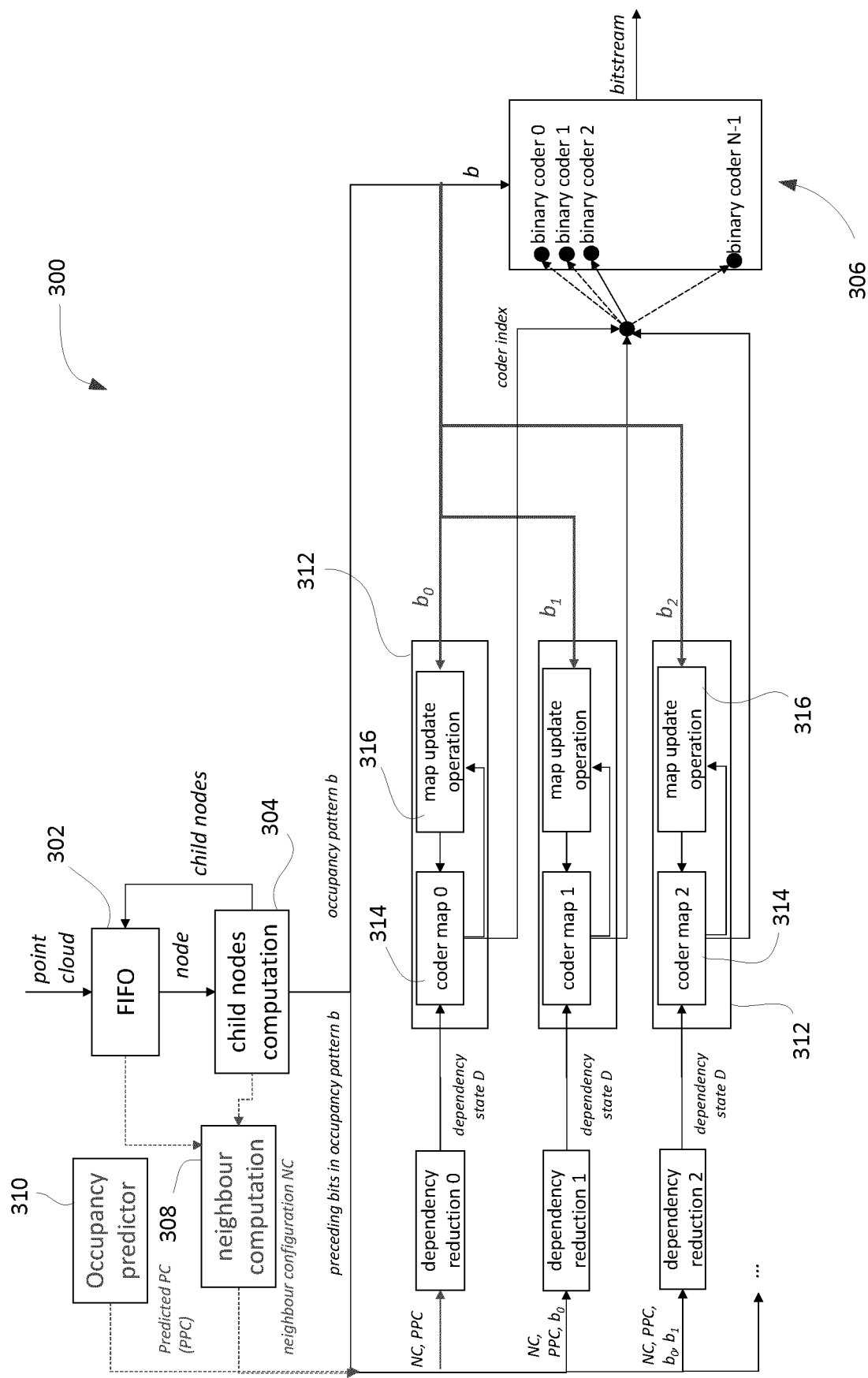
FIG. 3 shows, in block diagram form, a simplified example of an occupancy pattern encoder for a point cloud.

FIG. 3 shows, in block diagram form, a simplified example of an occupancy pattern encoder 300 for a point cloud. The encoder 300 in this example is encoding an occupancy pattern b containing individual bits $b_0$, $b_1$, $b_2$, . . . . The length of the pattern may be eight bits in the case of octree encoding, but may be other lengths if the coding involves other tree structures.

The encoder 300 in this example includes a FIFO buffer 302 for point cloud data and a child node computation unit 304 for determining occupancy data as the tree structure for coding is built from the point cloud data in the FIFO buffer 302. The child node computation unit 304 outputs an occupancy pattern b reflecting the occupancy status of the child nodes of a current node. That occupancy pattern b is to be coded bit-by-bit in order using N binary coders 306.

The encoder 300 in this example selects a binary coder on the basis of a dependency state D that results from a number of contextual dependencies. One of the dependencies is the preceding bits in the occupancy pattern. For bit $b_0$ there are none, but for each successive bit b in the pattern the dependency state takes into account the values of the preceding bits $b_0$ to $b_{i-1}$. Another of the dependencies is the neighbour configuration (NC). A neighbour computation component 308 determines the NC based on the occupancy status of neighbouring nodes to the current node, in this example. A third dependency is a predicted occupancy for the sub-volume corresponding to the occupancy bit $b_i$ that is determined using one or both of intra-prediction or inter-prediction to build a predicted point cloud (PPC). The PPC is generated by an occupancy predictor 310 based on a prediction mode, and may indicate whether the corresponding sub-volume is predicted occupied, predicted unoccupied, or unpredicted. Other implementations may use some, none, or all of the dependencies, and/or other dependencies to determine the dependency state D.

To illustrate, the dependency state in this example is determined from the combination of previously coded occupancy bits, reduced neighbour configuration, and inter prediction result. As an example, for the fourth occupancy bit, $b_3$, its dependency state will be based on the value of $b_0$, the value of $b_1$, the value of $b_2$, the occupancy status of neighbouring blocks that gives a value NC in the range [0,9], and an inter-prediction process that gives a value $PPC_3$ of "non-occupied" (0), "occupied" (1), or "unpredicted" (2). The resulting dependency state D thus has a value between 0 and 239 that reflects the unique combination of these factors; as there are 2×2×2×10×3=240 possible combinations.

In this example, for each bit $b_i$ of the occupancy pattern, some dependency reduction may be applied to reduce the number of potential dependency states before providing the dependency state D to a mapping process 312. The mapping process 312 includes the coder map 314 and the map update operation 316. For bit $b_0$, the dependency state $D_0$ generated from the dependencies on NC and PPC is used to find an index $i_0$ using the coder map 314. That index $i_0$ identifies the binary coder 306 that is used to code the occupancy bit $b_0$. The encoder 300 then updates the coder map 314 by way of the map update operation 316 based on the actual value of bit $b_0$, to adjust the index to which dependency state $D_0$ is mapped.

Each of the bits is coded in this manner in turn, with on-the-fly updating of the coder maps 314 after the bits are encoded.

Figure 4:
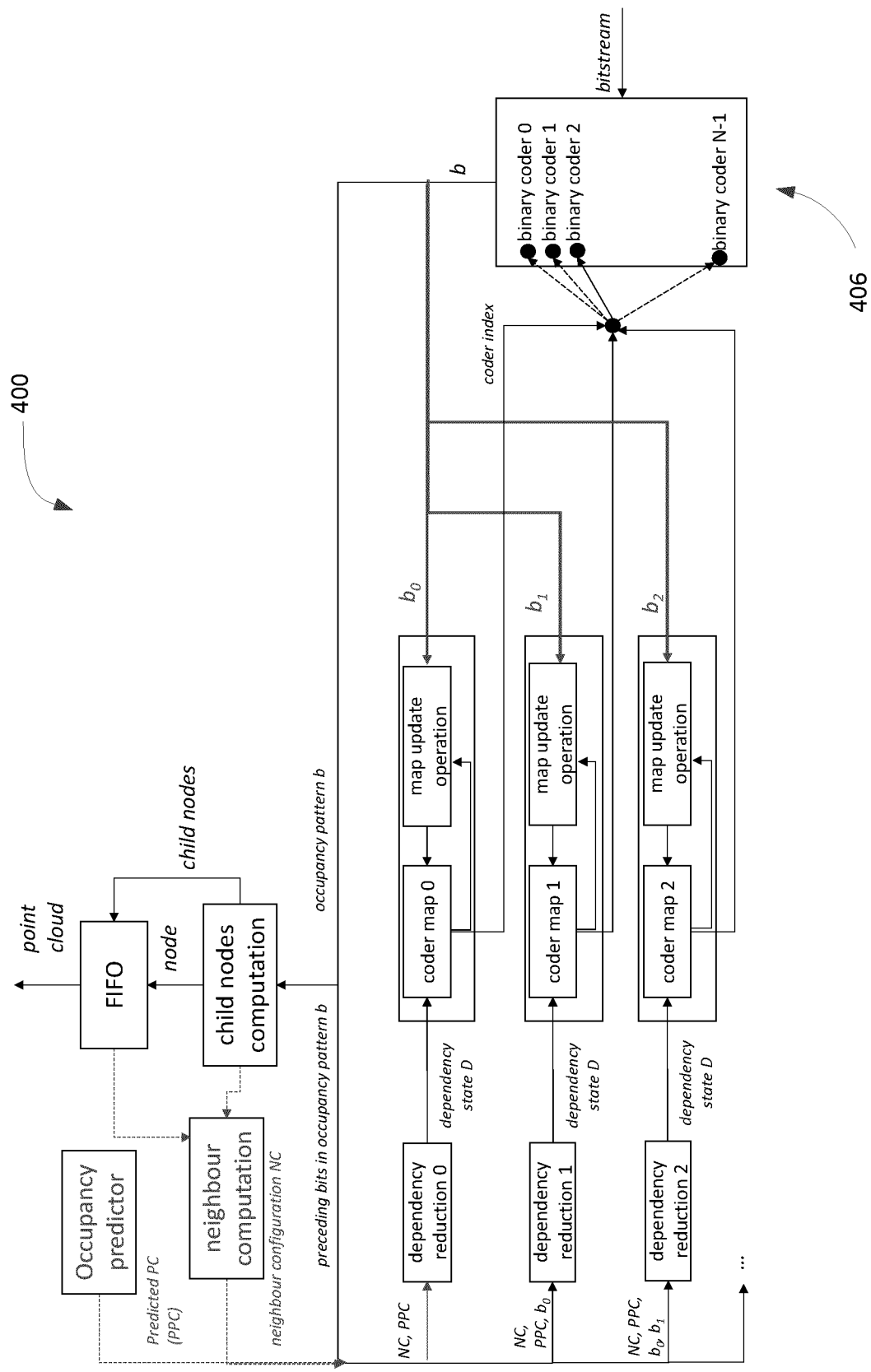
FIG. 4 shows a simplified example of an occupancy pattern decoder for a point cloud.

A corresponding example occupancy pattern decoder 400 is shown in FIG. 4. It will be noted that the decoder 400 employs the same dependency determination found in the encoder 300 (FIG. 3). In the case of the decoder, binary coders 406 receive the bitstream of encoded point cloud data and the determined dependency state is used to find the index identifying which of the binary coders 406 is to be used to decode an occupancy bit of the occupancy pattern. In this manner, the decoder 400 reconstructs the occupancy pattern, which in turn is used to build out the tree-structure and reconstruct the point cloud. The decoder 400 implements the same dependency state determination, coder mapping, and on-the-fly update described above with regard to the encoder 300 (FIG. 3), so enable the decoder 400 to accurately decode the bitstream.

Optimal Coders

As noted above, the encoder and decoder each have a set of N binary coders. Each coder has a respective probability associated with it, and the respective probabilities may be selected to fall within the range (0, 1) in a uniform or non-uniform distribution. In some embodiments, the binary coders are selected so as to be a set of N ε-optimal binary coders. Such a set of binary coders is considered ε-bounded if (a) they cover the range (0, 1) of coding probabilities for a selected acceptable entropy threshold ε, and (b) the error E in mapping from a probability p that is associated with the dependency state D to binary coder associated probability $p_i$ is uniformly transferred to an extra cost of entropy bounded by (E+1)ε, a penalty relative to coding with an optimal coder with probability p. Therefore, coding a symbol with a probability p in the range [$p_{i-1}$, $p_{i+1}$] using binary coder $C_i$ associated with probability $p_i$ results in an extra entropy of at most ε relative to coding with an optimal coder having associated probability p. That is, the ordered set of coders for coding the symbols of the channel will cost at most ε extra bits per symbol due to a mismatch in the associated probability $p_i$ of the binary coder mapped to dependency state D and the probability associated with the dependency state D. Note that the binary coders may be selected to cover the range (0, 1], [0, 1), or [0, 1] in some embodiments.

A set of ε-bounded coders is said to be a set of ε-optimal coders if its number of coders is a minimum.

Figure 5:
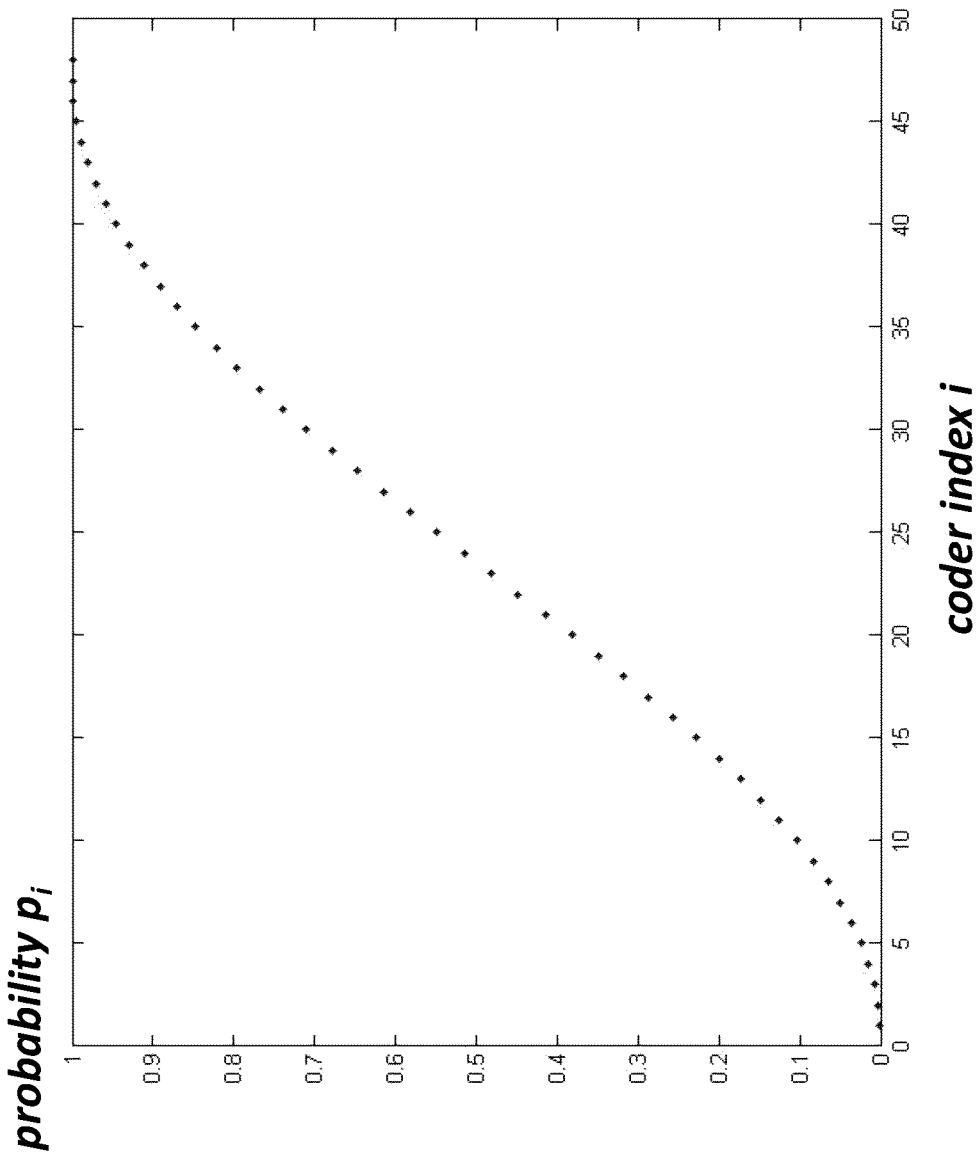
FIG. 5 shows a graph of an example distribution of probabilities assigned to a set of optimal coders.

Reference is now made to FIG. 5, which shows a graph of an example distribution for N=48 ε-optimal coders over the range [0, 1]. It will be noted that the distribution is not linear.

In one embodiment, the set of binary coders may be selected by:

1. Choosing an entropy threshold ε;
2. Initializing $p_i$ to be arbitrarily small;
3. Determining $p_{i+1}$ from $p_i$ incrementally until $p_{i+1}$ is arbitrarily close to 1 by
   a. For a probability p, define an entropy error E relative to $p_i$ as:

$$E(p,p_i)=p_i[-\log_2(p)+\log_2(p_i)]+(1-p_1)[-\log_2(1-p)+\log_2(1-p_i)]$$

b. Set $p_{i+1}$ as the lowest probability that ensures the error E is bounded by the entropy threshold ε:

$$p_{i+1}=\min\{p|E(p,p_i)\leq\varepsilon\ \&\ p>p_i\}$$

4. Optionally, add a last probability $p_N$ equal to 1.

As a non-limiting example, the above technique may be used to realize a set of N=256 optimal binary coders by setting a entropy threshold ε=1.0870e-04 and a first probability $p_1$=1e-6. The resulting full set of 256 probabilities $p_i$ is:

LUT_proba_coders[256]={1e-06, 8.1e 05, 0.000251, 0.000501, 0.000831, 0.001241, 0.001731, 0.002301, 0.002941, 0.003661, 0.004461, 0.005331, 0.006281, 0.007301, 0.008401, 0.009581, 0.010831, 0.012161, 0.013561, 0.015031, 0.016581, 0.018201, 0.019891, 0.021661, 0.023501, 0.025411, 0.027391, 0.029451, 0.031581, 0.033781, 0.036051, 0.038391, 0.040801, 0.043281, 0.045831, 0.048451, 0.051141, 0.053891, 0.056711, 0.059601, 0.062561, 0.065581, 0.068671, 0.071821, 0.075041, 0.078321, 0.081671, 0.085081, 0.088551, 0.092081, 0.095681, 0.099341, 0.10306, 0.10684, 0.11068, 0.11458, 0.11853, 0.12254, 0.12661, 0.13073, 0.13491, 0.13915, 0.14344, 0.14778, 0.15218, 0.15663, 0.16113, 0.16568, 0.17028, 0.17493, 0.17963, 0.18438, 0.18918, 0.19402, 0.19891, 0.20385, 0.20883, 0.21385, 0.21892, 0.22403, 0.22918, 0.23437, 0.2396, 0.24487, 0.25018, 0.25553, 0.26091, 0.26633, 0.27178, 0.27727, 0.28279, 0.28834, 0.29393, 0.29955, 0.3052, 0.31088, 0.31659, 0.32232, 0.32808, 0.33387, 0.33968, 0.34551, 0.35137, 0.35725, 0.36315, 0.36907, 0.37501, 0.38097, 0.38695, 0.39294, 0.39895, 0.40498, 0.41102, 0.41707, 0.42314, 0.42922, 0.43531, 0.44141, 0.44752, 0.45363, 0.45975, 0.46588, 0.47201, 0.47815, 0.48429, 0.49043, 0.49657, 0.50271, 0.50885, 0.51499, 0.52113, 0.52726, 0.53339, 0.53952, 0.54564, 0.55175, 0.55785, 0.56395, 0.57004, 0.57611, 0.58217, 0.58822, 0.59426, 0.60028, 0.60629, 0.61228, 0.61825, 0.62421, 0.63015, 0.63607, 0.64197, 0.64785, 0.6537, 0.65953, 0.66534, 0.67112, 0.67687, 0.6826, 0.6883, 0.69397, 0.69961, 0.70522, 0.7108, 0.71635, 0.72187, 0.72735, 0.7328, 0.73821, 0.74359, 0.74893, 0.75423, 0.75949, 0.76472, 0.76991, 0.77505, 0.78015, 0.78521, 0.79023, 0.7952, 0.80013, 0.80501, 0.80985, 0.81464, 0.81938, 0.82408, 0.82873, 0.83333, 0.83788, 0.84238, 0.84682, 0.85121, 0.85555, 0.85983, 0.86406, 0.86824, 0.87236, 0.87642, 0.88043, 0.88438, 0.88827, 0.8921, 0.89587, 0.89958, 0.90323, 0.90682, 0.91035, 0.91382, 0.91723, 0.92058, 0.92386, 0.92708, 0.93023, 0.93332, 0.93634, 0.9393, 0.94219, 0.94502, 0.94778, 0.95047, 0.95309, 0.95565, 0.95814, 0.96056, 0.96291, 0.96519, 0.9674, 0.96954, 0.97161, 0.97361, 0.97554, 0.97739, 0.97917, 0.98088, 0.98252, 0.98409, 0.98558, 0.987, 0.98835, 0.98962, 0.99082, 0.99195, 0.993, 0.99398, 0.99489, 0.99572, 0.99648, 0.99716, 0.99777, 0.9983, 0.99876, 0.99915, 0.99946, 0.9997, 0.99987, 0.99997, 1};

Intermediate Coder Mapping

In some instances, it may be noted that there is a trade-off to be made in balancing the desire for few binary coders to ease implementation and cost, and the desire for a large number of binary coders to allow for fine tracking (to improve compression efficiency) of coder index in the coder mapping. One possible solution is to decouple the number of implemented binary coders ("true" coders) from the fidelity of the coder indices used in the coder mapping. That is, there may be more coder indices than there are true coders, which means introducing a second coder map that maps the coder indices from the coder map to the true coders. This may be termed a second coder map or a "true" coder map.

Figure 6:
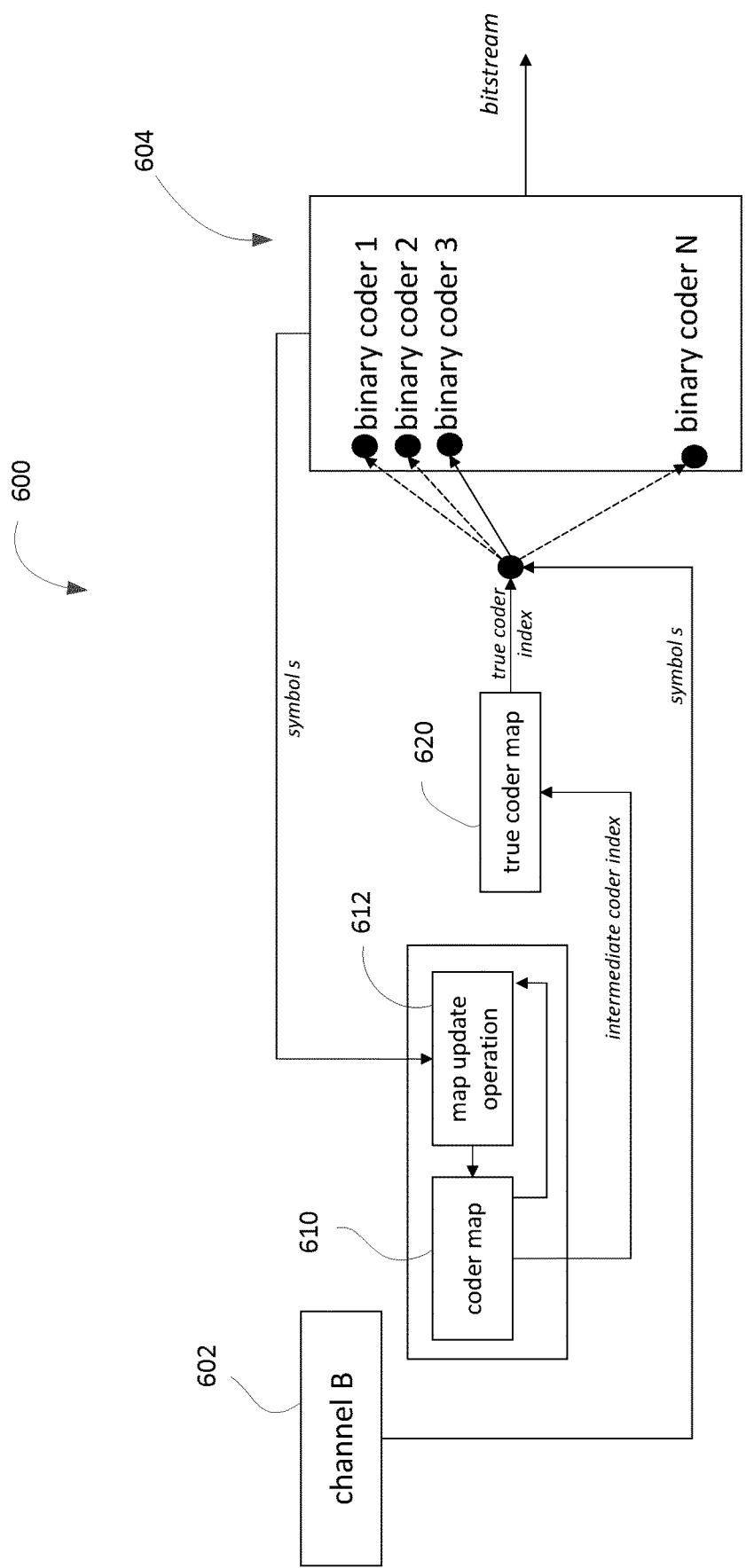
FIG. 6 shows, in block diagram form, one example of a symbol encoder with an intermediate coder mapping.

Reference is now made to FIG. 6, which shows, in block diagram form, another example of a channel encoder 600. In this example, the channel encoder 600 receives symbols from a channel 602 and uses a number N of "true", or implemented, binary coders 604. The encoder 600 includes a coder map 610 that maps each dependency state D to a coder index (may be termed an "intermediate coder index"), and a map update operation 612 that may operate as described above. The intermediate coder index may range from 0 to M, where M>N. The encoder 600 thus includes a true coder map 620 that maps the intermediate coder index to a true coder index that specifies one of the N true binary coders 604.

For example, one may use a set of 256 intermediate optimal coders to obtain a mapping with fine update. On the other hand, a set of N=32 true optimal coders is big enough to obtain a threshold ($\varepsilon$=0.0076 bit) that does not significantly impact compression performance. In this example, the true coder map 620 maps [1, 256] to [0, 32]. It will be appreciated that such a map may be advantageously implemented using a right shift of 3 bits.

Inferred Occupancy Bits

In some cases, the value of an occupancy bit may be inferred instead of being encoded and decoded. For example, if the occupancy pattern coded can be assumed to contain at least one occupied sub-volume, i.e. at least one MPS, then if the first seven bits of an occupancy pattern are 0 then the last occupancy bit can be inferred to be 1. Other constraints on the occupancy pattern or contextual information may be used to enable inferences in other cases.

An inferred bit is not encoded or decoded. Nevertheless, it may be advantageous to update the mapping model to capture the statistic of the last bit being present, even though the bit itself is not coded. The context model itself, i.e. the internal probability of an adaptive binary coder, may not be updated, in keeping with the usual practice of the context model modelling the coded bins.

An example is illustrated using the following pseudo-code. The map ctxIdxMap refers to the coder map. The function ctxIdxMap.evolve( ) refers to the update process for ctxIdxMap. For an i-th occupancy bit at the encoder, the example process may be expressed as:

ctxIdx=ctxIdxMap[i][numOccupiedAcc];

ctxIdxMap.evolve(occBit, &ctxIdxMap[i][numOccupiedAcc]);

//NB: There must be at least minOccupied child nodes

// --avoid coding the occupancyBit if it is implied.

if (numOccupiedAcc>=minOccupied+i-7) arithmeticEncoder→encode(occBit, ctxOccupancy[ctxIdx]);

Likewise, at the decoder, the example process may be expressed as:

```
// NB: There must be at least two occupied child nodes
// -- avoid coding the occupancyB if it is implied.
if (numOccupiedAcc >= minOccupied + i - 7) {
    int ctxIdx = ctxIdxMap[i][numOccupiedAcc];
    occBit = arithmeticDecoder->decode(ctxOccupancy[ctxIdx]);
}
ctxIdxMap.evolve(occBit, &ctxIdxMap[i][numOccupiedAcc]);
```

It will further be appreciated that the opposite approach may be suitable in some cases. That is, in some implementations, the mapping is explicitly not updated in the case that the bit is inferred, causing slightly different statistics.

Initialization

Interestingly, it has been observed in testing that the initialization of the coder map does not have a significant impact on the compression performance. For example, the coder map may, in some cases, be initialized for all dependency states D to an initial coder index that points to the binary coders with probability closest to 0.5, mapping all dependency states to this binary coder. It has been observed that the mapping quickly adapts to the content. Accordingly, the described techniques are independent of the nature of the content.

Impact on Compression Performance

The described techniques may provide for advantages in an easier implementation, particularly in the case of hardware implementation of the binary coders. The binary coders may be fixed or adaptive. The use of fixed binary coders may degrade compression performance slightly as compared to adaptive binary coders. A side effect advantage of reducing the number of binary coders is that issues of context dilution are reduced, even more so in the case of intermediate-true coder abstraction, which improves performance. Finally, the coder map update is performed on-the-fly bit-by-bit with a map update every eight bits, meaning the update occurs while the other bits of the occupancy pattern are being encoded. This means the mapping-update technique has no impact on the coding pipeline and the update computing is constant, ensuring smooth throughput. In testing the technique shows an improvement in compression performance over prior methods, while greatly simplifying implementation and reducing cost. In the case of fixed binary coders, there may be a slight degradation in compression performance over the best of the prior methods, yet providing a significant simplification in implementation, cost, and adaptability to any content type.

Figure 7:
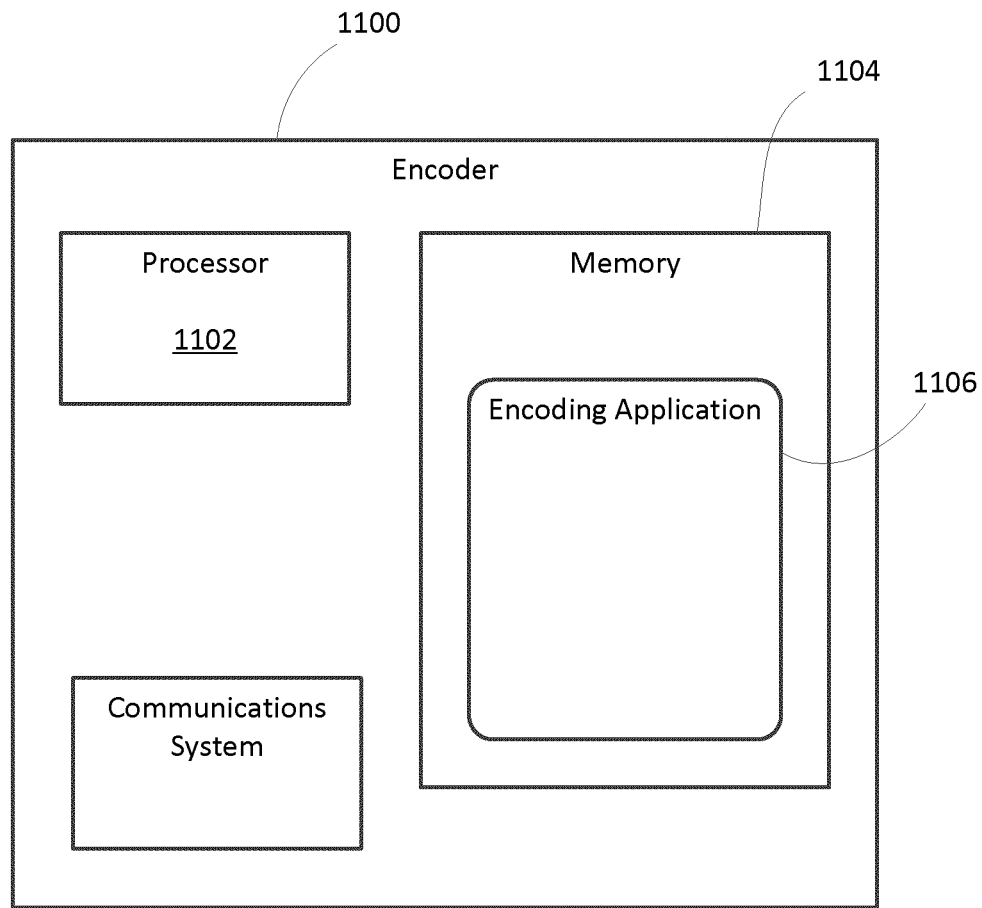
FIG. 7 shows an example simplified block diagram of an encoder.

Reference is now made to FIG. 7, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 8:
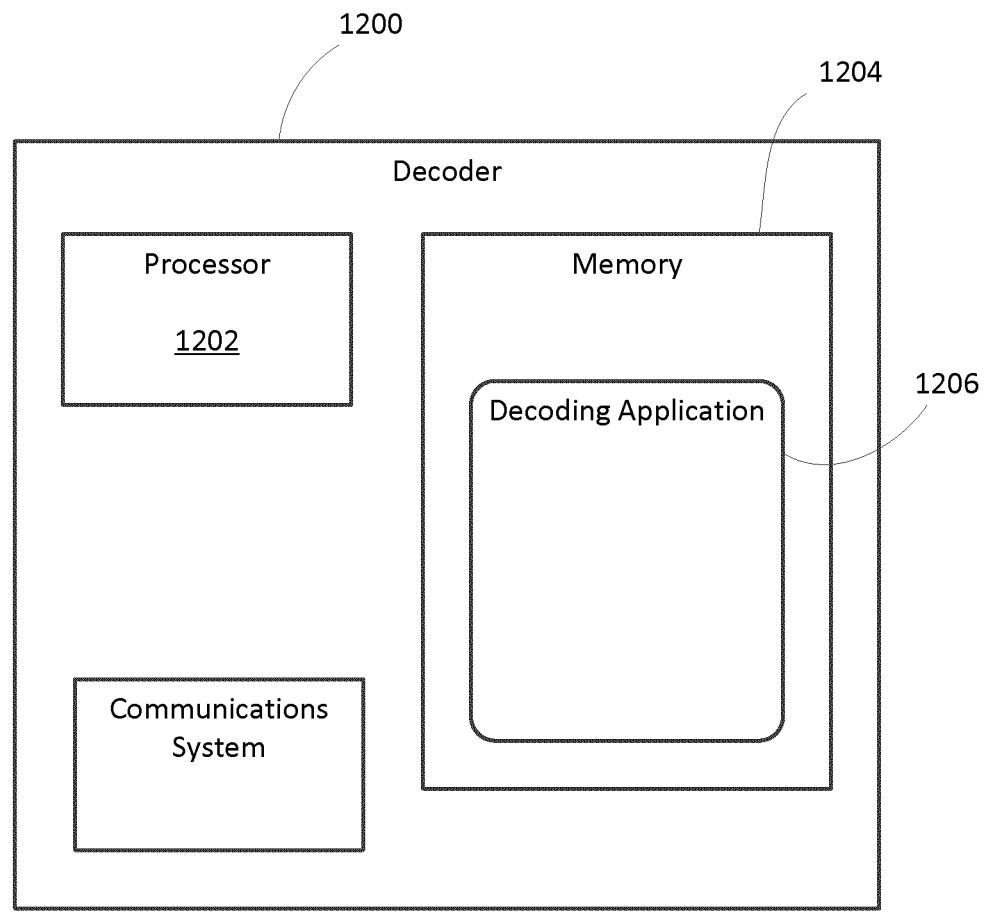
FIG. 8 shows an example simplified block diagram of a decoder.

Reference is now also made to FIG. 8, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive.

What is claimed is:

1. A method of encoding a point cloud to generate a bitstream of compressed point cloud data, the point cloud being located within a volume recursively split into sub-volumes and containing the points of the point cloud, wherein occupancy of sub-volumes of the volume is indicated using a bit sequence with each occupancy bit of the bit sequence indicating whether a respective sub-volume in a scan order within the volume contains at least one of the points, the method using a plurality of binary coders each having an associated probability, where the associated probabilities are distributed in the range (0, 1), the method comprising:

for each of the occupancy bits of the bit sequence, in turn,
determining a first dependency state for that occupancy bit, where the first dependency state is one of a range of defined dependency states;
identifying, using a coder map that maps each dependency state to a respective one of the binary coders, a first coder to be used in entropy encoding the occupancy bit based on the first dependency state;
entropy encoding the occupancy bit using the first coder;
identifying a second coder based on the first coder and a value of the occupancy bit; and
updating the coder map to map the first dependency state to the second coder.

2. The method claimed in claim 1, wherein the coder map includes a first look-up table that maps each dependency state to a respective one of the binary coders.

3. The method claimed in claim 1, wherein identifying a second coder includes:
   determining a new probability associated with the first dependency state based on the value of the occupancy bit; and
   identifying the second coder from among the plurality of binary coders on the basis that the associated probability of the second coder is closest among the associated probabilities to the new probability.

4. The method claimed in claim 3, wherein determining a new probability includes determining a new probability based on the associated probability of the first coder, the value of the occupancy bit, and a fixed parameter.

5. The method claimed in claim 4, wherein determining the new probability is based on the expression:

$$p_{new}=(Lp_i+s)/(L+1)$$

wherein $p_{new}$ is the new probability, $p_i$ is the associated probability of the first coder, s is the value of the occupancy bit, and L is the fixed parameter.

6. The method claimed in claim 1, wherein identifying a second coder includes selecting a second look-up table if the occupancy bit is 0 and a third look-up table if the occupancy bit is 1, and wherein the second look-up table and the third look-up table each respectively map binary coder indices to updated binary coder indices.

7. The method claimed in claim 1, wherein identifying a first coder includes:
   identifying, using the coder map, an intermediate coder index from among M intermediate coder indices, and
   identifying, based on the intermediate coder index, the first coder using a true coder map, wherein the number of binary coders is fewer than the M intermediate coder indices.

8. The method claimed in claim 1, wherein the plurality of binary coders include a set of ε-optimal binary coders.

9. The method claimed in claim 1, wherein the binary coders are fixed probability binary coders or are adaptive probability binary coders, and wherein the associated probability of each binary coder does not change during the encoding.

10. The method claimed in claim 1, wherein the first dependency state is based on one or more of an intra-prediction using spatially-related point cloud data, an inter-prediction using temporally-related point cloud data, previously-coded occupancy bits of the bit sequence, and occupancy information regarding previously-coded neighbouring sub-volumes.

11. An encoder for encoding a point cloud to generate a bitstream of compressed point cloud data, the encoder comprising:
   a processor;
   memory; and
   an encoding application containing instructions executable by the processor that, when executed, cause the processor to:
      for each of the occupancy bits of the bit sequence, in turn,
         determine a first dependency state for that occupancy bit, where the first dependency state is one of a range of defined dependency states;
         identify, using a coder map that maps each dependency state to a respective one of the binary coders, a first coder to be used in entropy encoding the occupancy bit based on the first dependency state;
         entropy encode the occupancy bit using the first coder;
         identify a second coder based on the first coder and a value of the occupancy bit; and
         update the coder map to map the first dependency state to the second coder.

12. A decoder for decoding a bitstream of compressed point cloud data to produce a reconstructed point cloud, the decoder comprising:
   a processor;
   memory; and
   a decoding application containing instructions executable by the processor that, when executed, cause the processor to:
      for each of the occupancy bits of the bit sequence, in turn,
         determine a first dependency state for that occupancy bit, where the first dependency state is one of a range of defined dependency states;
         identify, using a coder map that maps each dependency state to a respective one of the binary coders, a first coder to be used in entropy decoding the occupancy bit based on the first dependency state;
         entropy decode the occupancy bit from the bitstream using the first coder;
         identify a second coder based on the first coder and a value of the decoded occupancy bit; and
         update the coder map to map the first dependency state to the second coder.

13. A method of decoding a bitstream of compressed point cloud data to produce a reconstructed point cloud, the point cloud being located within a volume recursively split into sub-volumes and containing the points of the point cloud, wherein occupancy of sub-volumes of the volume is indicated using a bit sequence with each occupancy bit of the bit sequence indicating whether a respective sub-volume in a scan order within the volume contains at least one of the points, the method using a plurality of binary coders each having an associated probability, where the associated probabilities are distributed in the range (0, 1), the method comprising:
   for each of the occupancy bits of the bit sequence, in turn,
      determining a first dependency state for that occupancy bit, where the first dependency state is one of a range of defined dependency states;
      identifying, using a coder map that maps each dependency state to a respective one of the binary coders, a first coder to be used in entropy decoding the occupancy bit based on the first dependency state;
      entropy decoding the occupancy bit from the bitstream using the first coder;
      identifying a second coder based on the first coder and a value of the decoded occupancy bit; and
      updating the coder map to map the first dependency state to the second coder.

14. The method claimed in claim 13, wherein the coder map includes a first look-up table that maps each dependency state to a respective one of the binary coders.

15. The method claimed in claim 13, wherein identifying a second coder includes:
   determining a new probability associated with the first dependency state based on the value of the occupancy bit; and identifying the second coder from among the plurality of binary coders on the basis that the associated probability of the second coder is closest among the associated probabilities to the new probability.

16. The method claimed in claim 15, wherein determining a new probability includes determining a new probability based on the associated probability of the first coder, the value of the occupancy bit, and a fixed parameter.

17. The method claimed in claim 16, wherein determining the new probability is based on the expression:

$$p_{new}=(Lp_i+s)/(L+1)$$

wherein $p_{new}$ is the new probability, $p_i$ is the associated probability of the first coder, s is the value of the occupancy bit, and L is the fixed parameter.

18. The method claimed in claim 13, wherein identifying a second coder includes selecting a second look-up table if the occupancy bit is 0 and a third look-up table if the occupancy bit is 1, and wherein the second look-up table and the third look-up table each respectively map binary coder indices to updated binary coder indices.

19. The method claimed in claim 13, wherein identifying a first coder includes:

identifying, using the coder map, an intermediate coder index from among M intermediate coder indices, and identifying, based on the intermediate coder index, the first coder using a true coder map, wherein the number of binary coders is fewer than the M intermediate coder indices.

20. The method claimed in claim 13, wherein the plurality of binary coders include a set of ε-optimal binary coders.

21. The method claimed in claim 13, wherein the binary coders are fixed probability binary coders or are adaptive probability binary coders, and wherein the associated probability of each binary coder does not change during the encoding.

22. The method claimed in claim 13, wherein the first dependency state is based on one or more of an intra-prediction using spatially-related point cloud data, an inter-prediction using temporally-related point cloud data, previously-coded occupancy bits of the bit sequence, and occupancy information regarding previously-coded neighbouring sub-volumes.

* * * * *